United States Patent
Ryohwa et al.

(10) Patent No.: US 10,886,442 B2
(45) Date of Patent: Jan. 5, 2021

(54) PHOSPHOR CONTAINING PARTICLE, AND LIGHT EMITTING DEVICE AND PHOSPHOR CONTAINING SHEET USING THE SAME

(71) Applicant: Sharp Kabushiki Kaisha, Sakai (JP)

(72) Inventors: Tatsuya Ryohwa, Sakai (JP); Kanako Nakata, Sakai (JP); Hiroshi Fukunaga, Sakai (JP); Makoto Izumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/596,870

(22) Filed: Oct. 9, 2019

(65) Prior Publication Data

US 2020/0044124 A1 Feb. 6, 2020

Related U.S. Application Data

(62) Division of application No. 15/981,941, filed on May 17, 2018, now Pat. No. 10,483,441.

(30) Foreign Application Priority Data

Jun. 9, 2017 (JP) ................. 2017-114474
Jun. 9, 2017 (JP) ................. 2017-114475

(51) Int. Cl.
*H01L 33/50* (2010.01)
*C09K 11/08* (2006.01)

(52) U.S. Cl.
CPC ............ *H01L 33/504* (2013.01); *C09K 11/08* (2013.01); *H01L 33/502* (2013.01); *H01L 33/505* (2013.01)

(58) Field of Classification Search
CPC ..................... H01L 33/504; H01L 33/505
See application file for complete search history.

(56) References Cited

U.S. PATENT DOCUMENTS

2011/0068322 A1* 3/2011 Pickett ............... C09K 11/02
257/13
2013/0189803 A1* 7/2013 Nasaani ............. H01L 33/505
438/27

(Continued)

FOREIGN PATENT DOCUMENTS

CN 104066814 A 9/2014
CN 106410018 A 2/2017

OTHER PUBLICATIONS

Ryohwa et al., "Phosphor Containing Particle, and Light Emitting Device and Phosphor Containing Sheet Using the Same", U.S. Appl. No. 15/981,941, filed May 17, 2018.

*Primary Examiner* — Dung A. Le
(74) *Attorney, Agent, or Firm* — Keating & Bennett, LLP

(57) ABSTRACT

A phosphor containing particle including a core portion which is a particulate matter of resin including a constitutional unit derived from an ionic liquid with a semiconductor nanoparticle phosphor dispersed therein and a shell portion which is a matter in a form of a layer of resin which includes a constitutional unit derived from an ionic liquid and coats at least a portion of the core portion, and a phosphor containing particle including a particulate matter of resin including a constitutional unit derived from an ionic liquid with a semiconductor nanoparticle phosphor dispersed therein and a metal oxide layer coating at least a portion of the particulate matter of resin. A light emitting device including a light source and a wavelength converter in which phosphor containing particles are dispersed in a translucent medium, and a phosphor containing sheet in which phosphor containing particles are dispersed in a sheet-shaped translucent medium.

15 Claims, 5 Drawing Sheets

(56) References Cited

U.S. PATENT DOCUMENTS

2017/0030532 A1    2/2017  Ryohwa et al.
2017/0125650 A1*   5/2017  Pickett .................. G02B 6/0073
2017/0166807 A1*   6/2017  Kuzumoto ........... C09K 11/025

* cited by examiner

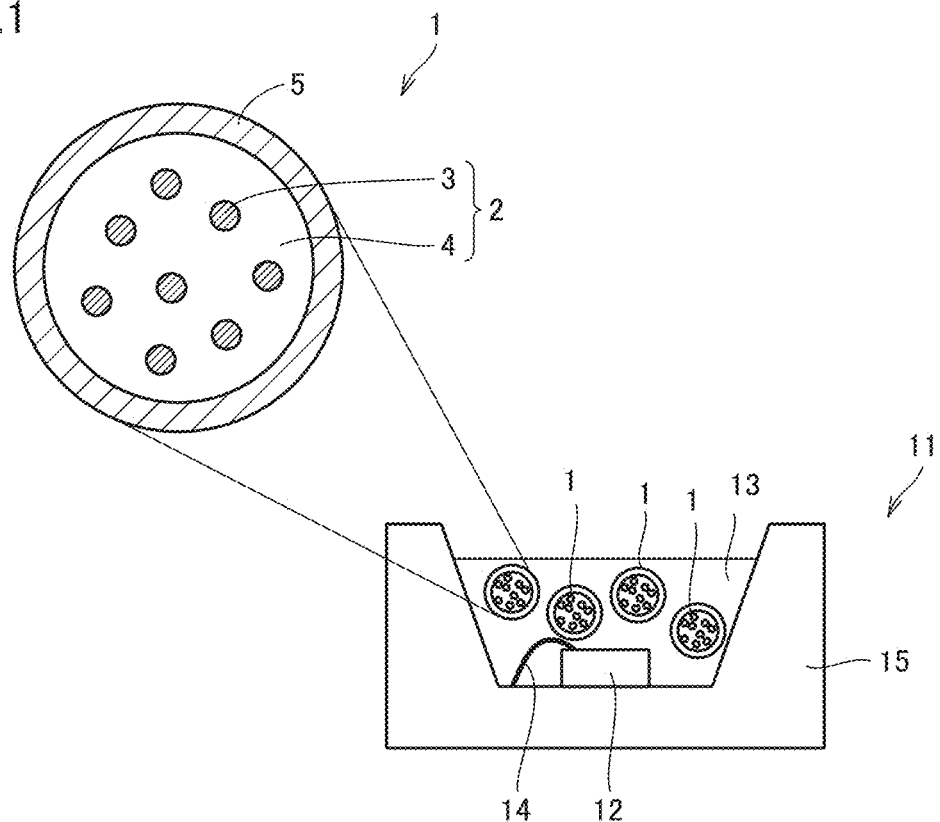
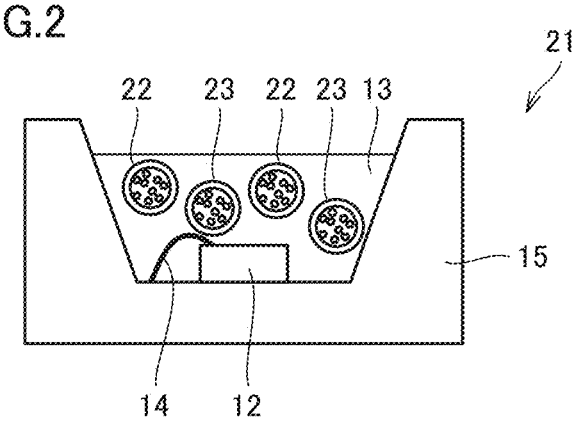

PHOSPHOR CONTAINING PARTICLE, AND LIGHT EMITTING DEVICE AND PHOSPHOR CONTAINING SHEET USING THE SAME

This nonprovisional application is based on Japanese Patent Application Nos. 2017-114475 and 2017-114474 filed on Jun. 9, 2017, with the Japan Patent Office, the entire contents of which are hereby incorporated by reference.

BACKGROUND OF THE INVENTION

Field of the Invention

The following disclosure relates to a phosphor containing particle, and a light emitting device and a phosphor containing sheet using the same.

Description of the Background Art

Semiconductor nanoparticle phosphor, also referred to as a quantum dot, is of commercial interest for an electronic characteristic size-tuneable by the quantum size effect. The size-tuneable electronic characteristic is able to be used in a variety of applications such as biological labeling, photovoltaic power generation, catalysis, biological image pickup, LED, general space lighting, and an electron emission display.

However, semiconductor nanoparticle phosphor has a disadvantage in that when it is exposed to moisture, heat, or ultraviolet rays, it has impaired light emission characteristics. Furthermore, when semiconductor nanoparticle phosphor is directly incorporated in a sealing layer of silicone resin or the like, agglomeration occurs resulting in impaired optical characteristics.

In order to solve these problems, for example, Japanese National Patent Publication No. 2013-505347 discloses a plurality of coated primary particles such that each primary particle is composed of a primary matrix material and includes a group of semiconductor nanoparticles, each primary particle is individually provided with a layer of a surface coating material, the primary particle has a microbead structure, and the surface coating material includes a polymeric material. A plurality of primary particles thus coated is able to reduce reactivity to a surrounding environment and a process performed after the primary particles are produced.

However, according to a conventional technique disclosed in Japanese National Patent Publication No. 2013-505347, atomic layer deposition (ALD) is used as a method of coating the primary particle, and this method requires a high reaction temperature such as 100° C. or higher and 400° C. or lower. For this reason, heat applied in coating a surface of the bead for protection impairs semiconductor nanoparticle phosphor's light emission characteristics.

SUMMARY OF THE INVENTION

The following disclosure has been made to solve the above problems, and an object thereof is to provide a novel phosphor containing particle using a semiconductor nanoparticle phosphor, that has high light emission efficiency and increased chemical stability.

One aspect of the present invention provides a phosphor containing particle characterized by comprising a core portion which is a particulate matter of resin including a constitutional unit derived from an ionic liquid with a semiconductor nanoparticle phosphor dispersed therein, and a shell portion which is a matter in the form of a layer of resin which includes a constitutional unit derived from an ionic liquid and coats at least a portion of the core portion (hereinafter also referred to as a "phosphor containing particle of the first invention").

The phosphor containing particle of the first invention comprises a core portion which is a particulate matter of resin including a constitutional unit derived from an ionic liquid with a semiconductor nanoparticle phosphor dispersed therein, and a shell portion which is a matter in the form of a layer of resin which includes a constitutional unit derived from an ionic liquid and coats at least a portion of the core portion. The phosphor containing particle of the first invention is able to be produced without being heated at a high temperature such as that of the conventional ALR method, and thus a phosphor containing particle is able to be provided which has high light emission efficiency and excellent chemical stability, and is also excellent in handleability. Furthermore, since the core portion is protected by the presence of the shell portion, particles are able to be produced while the semiconductor nanoparticle phosphor's agglomeration is prevented, so that a high optical characteristic is able to be maintained, and even after the particles are produced, the semiconductor nanoparticle phosphor's degradation due to moisture and oxygen is able to be reduced effectively. Furthermore, the thus obtained first phosphor containing particle, when produced in a size approximately the same as a currently used phosphor, is able to be used in a form similar to that of a currently commercially used phosphor, and a light emitting device and a phosphor containing sheet, etc. using the same are able to be provided.

While the phosphor containing particle of the first invention allows the shell portion to provide protection to reduce degradation of the semiconductor nanoparticle phosphor in the core portion, the phosphor containing particle of the first invention is also able to be a particle including a nanoparticle phosphor (i.e., a phosphor containing particle) in the shell portion. This case is also able to reduce degradation of the semiconductor nanoparticle phosphor in the core portion. However, when the semiconductor nanoparticle phosphor in the shell portion is degraded, emission intensity decreases despite absorption of excitation light, which may cause a decrease in light emission efficiency as a phosphor containing particle. In other words, a particle (a phosphor containing particle) which does not include a nanoparticle phosphor in the shell is able to achieve a further effect of the present invention.

In the phosphor containing particle of the first invention, it is preferable that the shell portion does not include the semiconductor nanoparticle phosphor.

In the phosphor containing particle of the first invention, the shell portion preferably coats the entire surface of the core portion.

In the phosphor containing particle of the first invention, the resin in the core portion and the resin in the shell portion may be identical in type, or the resin in the core portion and the resin in the shell portion may be different in type.

In the phosphor containing particle of the first invention, preferably, at least one of the resin in the core portion and the resin in the shell portion is a resin including a constitutional unit derived from an ionic liquid having a polymerizable functional group. In that case, preferably, the resin in the core portion and the resin in the shell portion are both a resin including a constitutional unit derived from an ionic liquid having a (meth)acrylic acid ester group as the polymerizable functional group.

In the phosphor containing particle of the first invention, the resin in the shell portion preferably contains a cross-linking agent at a mixing ratio larger than that of the cross-linking agent contained by the resin in the core portion. In that case, preferably, the cross-linking agent contained by the resin in the shell portion has a weight ratio of more than 50% with respect to the entire resin, and the cross-linking agent contained by the resin in the core portion has a weight ratio of 50% or less with respect to the entire resin.

Preferably, the phosphor containing particle of the first invention has a particle size of about 100 nm or more and about 30 μm or less.

In the phosphor containing particle of the first invention, preferably, the shell portion has a thickness of about 0.1 μm or more and about 5 μm or less.

One aspect of the present invention also provides a light emitting device comprising a light source and a wavelength converter in which phosphor containing particles of the first invention as described above are dispersed in a translucent medium (hereinafter also referred to as a "light emitting device of the first invention").

The light emitting device of the first invention preferably includes a phosphor containing particle in which in the core a red fluorescent light emitting semiconductor nanoparticle phosphor is dispersed in a resin including a constitutional unit derived from an ionic liquid and a phosphor containing particle in which in the core a green fluorescent light emitting semiconductor nanoparticle phosphor is dispersed in a resin including a constitutional unit derived from an ionic liquid.

One aspect of the present invention also provides a phosphor containing sheet in which phosphor containing particles in one aspect of the present invention described above are dispersed in a sheet-shaped translucent medium (hereinafter also referred to as "phosphor containing sheet of the first invention").

One aspect of the present invention also provides a phosphor containing particle comprising a particulate matter of resin including a constitutional unit derived from an ionic liquid with a semiconductor nanoparticle phosphor dispersed therein, and a metal oxide layer coating at least a portion of the particulate matter of resin (hereinafter also referred to as a "phosphor containing particle of a second invention").

According to the phosphor containing particle of the second invention, by providing a particle (i.e., a phosphor containing particle) which has a semiconductor nanoparticle phosphor dispersed in a particulate matter of resin including a constitutional unit derived from an ionic liquid and includes a metal oxide layer coating at least a portion of the particulate matter of resin, such particles are able to be produced while the semiconductor nanoparticle phosphor's agglomeration is prevented, so that a high optical characteristic is able to be maintained, and even after the particles are produced, the semiconductor nanoparticle phosphor's degradation due to moisture and oxygen is able to be reduced. The phosphor containing particle of the second invention is able to be produced without being heated at a high temperature such as that of the conventional ALR method, and is thus able to have high light emission efficiency and excellent chemical stability, and is also excellent in handleability. Furthermore, the thus obtained phosphor containing particle of the second invention, when produced in a size approximately the same as a currently used phosphor, is able to be used in a form similar to that of a currently commercially used phosphor, and a light emitting device and a phosphor containing sheet, etc. using the same are able to be provided.

In the phosphor containing particle of the second invention, the metal oxide layer preferably coats the entire surface of the particulate matter of resin.

In the phosphor containing particle of the second invention, the ionic liquid is represented by the following general formula (I):

$$X^+Y^- \qquad (I),$$

where $X^+$ is preferably a cation selected from among imidazolium ion, pyridinium ion, phosphonium ion, aliphatic quaternary ammonium ion, pyrrolidinium, and sulfonium, and $Y^-$ is preferably an anion.

In the phosphor containing particle of the second invention, the ionic liquid is represented by the following general formula (I):

$$X^+Y^- \qquad (I),$$

where $X^+$ is preferably a cation, and $Y^-$ is preferably an anion selected from among tetrafluoroboric acid ion, hexafluorophosphoric acid ion, bistrifluoromethyl sulfonyl imide acid ion, perchloric acid ion, tris(trifluoromethylsulfonyl) carbon acid ion, trifluoromethanesulfonic acid ion, trifluoroacetic acid ion, carbonic acid ion, and halogen ion.

In the phosphor containing particle of the second invention, the ionic liquid is represented by the following general formula (I):

$$X^+Y^- \qquad (I),$$

where $X^+$ is preferably a cation selected from among imidazolium ion, pyridinium ion, phosphonium ion, aliphatic quaternary ammonium ion, pyrrolidinium, and sulfonium, and $Y^-$ is preferably an anion selected from among tetrafluoroboric acid ion, hexafluorophosphoric acid ion, bistrifluoromethyl sulfonyl imide acid ion, perchloric acid ion, tris(trifluoromethylsulfonyl) carbon acid ion, trifluoromethanesulfonic acid ion, trifluoroacetic acid ion, carbonic acid ion, and halogen ion.

In the phosphor containing particle of the second invention, the cation in the ionic liquid is preferably aliphatic quaternary ammonium ion.

In the phosphor containing particle of the second invention, the anion in the ionic liquid is preferably bistrifluoromethyl sulfonyl imide acid ion.

In the phosphor containing particle of the second invention, the ionic liquid preferably has a polymerizable functional group.

In the phosphor containing particle of the second invention, the ionic liquid is preferably (2-(methacryloyloxy)-ethyltrimethyl ammonium bis(trifluoromethane sulfonyl)imide), or 1-(3-acryloyloxy-propyl)-3-methylimidazolium bis(trifluoromethanesulfonyl) imide.

In the phosphor containing particle of the second invention, the metal oxide layer is more preferably composed of any material of $SiO_2$, ZnO, $TiO_2$, $CeO_2$, $SnO_2$, $ZrO_2$, $Al_2O_3$, ZnO:Mg, $Y_2O_3$, and MgO or a combination of these materials.

In the phosphor containing particle of the second invention, the particulate matter of resin is preferably spherical with a particle size of about 1 μm or more and about 50 μm or less.

In the phosphor containing particle of the second invention, the metal oxide layer is preferably composed of a particulate matter of a metal oxide having a particle size of about 1 nm or more and about 1 μm or less.

In the phosphor containing particle of the second invention, the metal oxide layer is preferably a stack of layers of the particulate matter of the metal oxide.

One aspect of the present invention also provides a light emitting device comprising a light source and a wavelength converter in which phosphor containing particles of the second invention as described above are dispersed in a translucent medium (hereinafter also referred to as a "light emitting device of the second invention").

One aspect of the present invention also provides a phosphor containing sheet in which the second phosphor containing particles described above are dispersed in a sheet-shaped translucent medium (hereinafter also referred to as a "phosphor containing sheet of the second invention").

The foregoing and other objects, features, aspects and advantages of the present invention will become more apparent from the following detailed description of the present disclosure when taken in conjunction with the accompanying drawings.

BRIEF DESCRIPTION OF THE DRAWINGS

FIG. 1 is a diagram schematically showing a preferable example of a phosphor containing particle of the first invention and a preferable example of a light emitting device of the first invention using the same.

FIG. 2 is a diagram schematically showing another preferable example of the light emitting device of the first invention.

DESCRIPTION OF THE PREFERRED EMBODIMENTS

Figure 3:
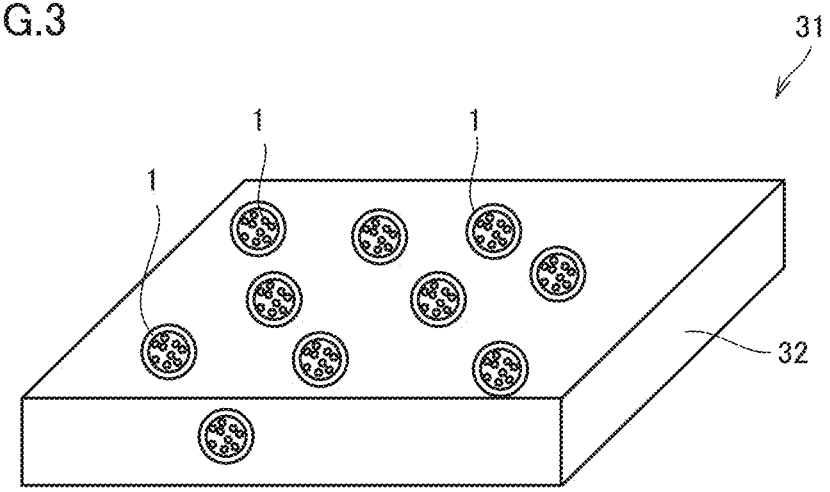
FIG. 3 is a diagram schematically showing a preferable example of a phosphor containing sheet of the first invention.

<Phosphor Containing Particle According to First Invention>

FIG. 1 is a diagram schematically showing a preferable example of a phosphor containing particle (a microbead) of a first invention. A phosphor containing particle 1 of the first invention is characterized by comprising a core portion 2 which is a particulate matter of resin 4 including a constitutional unit derived from an ionic liquid with a semiconductor nanoparticle phosphor 3 dispersed therein, and a shell portion 5 which is a matter in the form of a layer of resin which includes a constitutional unit derived from an ionic liquid and coats at least a portion of core portion 2.

The "ionic liquid" used for phosphor containing particle 1 of the first invention is preferably a salt in a molten state even at an ambient temperature (e.g., about 25° C.) (i.e., an ambient temperature molten salt) which is preferably expressed in a general formula (I) below:

$$X^+Y^- \qquad (I).$$

In the general formula (I), $X^+$ is a cation selected from among imidazolium ion, pyridinium ion, phosphonium ion, aliphatic quaternary ammonium ion, pyrrolidinium, and sulfonium. Among these, aliphatic quaternary ammonium ion is a particularly preferred cation as it is excellently stable against air and moisture in the atmosphere.

Furthermore, in the general formula (I), $Y^-$ is an anion selected from among tetrafluoroboric acid ion, hexafluorophosphoric acid ion, bistrifluoromethyl sulfonyl imide acid ion, perchloric acid ion, tris(trifluoromethylsulfonyl) carbon acid ion, trifluoromethanesulfonic acid ion, trifluoroacetic acid ion, carbonic acid ion, and halogen ion. Among these, bis trifluoromethyl sulfonyl imide acid ion is a particularly preferred anion as it is excellently stable against air and moisture in the atmosphere.

At least one of the ionic liquids used in core portion 2 and shell portion 5 of phosphor containing particle 1 of the first invention preferably has a polymerizable functional group. The ionic liquid having a polymerizable functional group for example includes (2-(methacryloyloxy)-ethyltrimethyl ammonium bis(trifluoromethane sulfonyl)imide) (hereinafter also referred to as "MOE-200T"), 1-(3-acryloyloxy-propyl)-3-methylimidazolium bis(trifluoromethanesulfonyl) imide, and the like. An ionic liquid which does not have a polymerizable functional group for example includes N,N, N-trimethyl-N-propyl ammonium bis(trifluoromethane sulfonyl) imide, N,N-dimethyl-N-methyl-2-(2-methoxy ethyl) ammonium bis(trifluoromethane sulfonyl)imide (hereinafter also referred to as "DEME-TFSI"), and the like. By including the ionic liquid having the polymerizable functional group, the ionic liquid functioning as a dispersion medium for the semiconductor nanoparticle phosphor is able to be polymerized as it is in the presence of the polymerizable functional group. Thus, by providing the resin including the constitutional unit derived from the ionic liquid having the polymerizable functional group by polymerizing the ionic liquid having the polymerizable functional group with the semiconductor nanoparticle phosphor being dispersed, agglomeration which would otherwise occur in solidification of the resin in which the semiconductor nanoparticle phosphor is dispersed is significantly reduced or prevented. Furthermore, as described above, the semiconductor nanoparticle phosphor is dispersed in the resin including the constitutional unit derived from the ionic liquid having the polymerizable functional group, so that the semiconductor nanoparticle phosphor is electrostatically stabilized, and the semiconductor nanoparticle phosphor is reliably and securely protected.

The ionic liquid having the polymerizable functional group as described above is able to be obtained by introducing a polymerizable functional group into a conventionally known appropriate ionic liquid in a conventionally known appropriate method, however, a commercially available product may of course be used.

Furthermore, in producing core portion 2 of phosphor containing particle 1 of the first invention, suitable conditions in accordance with a type or an amount of an ionic liquid having a polymerizable functional group to be used are selected as appropriate as conditions for a temperature and a time period for polymerization of the ionic liquid having the polymerizable functional group while the semiconductor nanoparticle phosphor is dispersed, and the conditions are not particularly restricted. For example, when MOE-200T is used as the ionic liquid having the polymerizable functional group, the polymerization is able to suitably be achieved, for example, under a condition of a temperature from 60° C. or higher and 100° C. or lower for 1 hour or more and 10 hours or less. Furthermore, for example when 1-(3-acryloyloxy-propyl)-3-methylimidazolium bis(trifluoromethanesulfonyl) imide is used as the ionic liquid having the polymerizable functional group, the polymerization is able to be suitably achieved, for example, under a condition of a temperature from about 60° C. or higher and 150° C. or lower for 1 hour or more and 10 hours or less.

When a catalyst is used in the polymerization, a catalyst to be used is not particularly restricted, and for example, conventionally known azobisisobutyronitrile, dimethyl 2,2'-azobis(2-methylpropionate) or the like is able to be used. Of these, for rapid progress of polymerization, azobisisobutyronitrile is preferably used as a catalyst.

Note that the ionic liquid used for phosphor containing particle 1 of the first invention may not have a polymerizable functional group, and may of course include an ionic liquid which partially does not have a polymerizable functional group. Furthermore, by adding diethyleneglycol dimethacrylate, 1,1,1-trimethylol propane triacrylate or the like promoting polymerization to the ionic liquid that does not have a polymerizable functional group, and polymerizing it, a resin including a constitutional unit derived from an ionic liquid may be had. Furthermore, within a range which does not obstruct an effect of the present invention, a resin may be obtained which includes a resin component such as epoxy, silicone and (meth) acrylate, and includes a constitutional unit derived from an ionic liquid.

Semiconductor nanoparticle phosphor 3 in phosphor containing particle 1 of the first invention is a single phosphor particle without scattering of visible light, and a conventionally known appropriate semiconductor nanoparticle phosphor is able to be used without being particularly restricted. By using the semiconductor nanoparticle phosphor, advantageously, an emission wavelength is able to be precisely controlled based on control of particle size and control of composition.

The semiconductor nanoparticle phosphor may be formed of any material, and may be formed of at least any material selected from CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, MgTe conventionally used as semiconductor nanoparticle phosphor. Furthermore, the semiconductor nanoparticle phosphor may be a two-component core type, three-component core type, four-component core type, core-shell type or core multishell type, doped or slanted semiconductor nanoparticle phosphor known to those skilled in the art. FIG. 1 shows a plurality of semiconductor nanoparticle phosphors of a single type dispersed in a resin 4 including a constitutional unit derived from an ionic liquid.

The shape of the semiconductor nanoparticle phosphor is not particularly restricted and a semiconductor nanoparticle phosphor including a conventionally known appropriate shape such as a globular shape, a rod shape, or a wire shape, for example, is able to be used without particularly being restricted. In particular, from a point of view of ease in control of light emission characteristics based on control of shape, a globular semiconductor nanoparticle phosphor is preferably used, for example.

The particle size of the semiconductor nanoparticle phosphor is able to be selected as appropriate in accordance with a source material and a desired emission wavelength, without being particularly restricted, however, it is preferably within a range of about 1 nm or more and about 20 nm or less, and more preferably within a range of about 2 nm or more and about 5 nm or less, for example. When the semiconductor nanoparticle phosphor has a particle size smaller than about 1 nm, a ratio of a surface area to a volume tends to increase, a surface defect tends to be dominant, and an effect tends to be lowered. When the semiconductor nanoparticle phosphor has a particle size exceeding about 20 nm, a state of dispersion tends to be low and agglomeration and settling tend to occur. When the semiconductor nanoparticle phosphor has a globular shape, the particle size refers, for example, to an average particle size measured with a particle size distribution measurement device or to a size of a particle observed with an electron microscope. When the semiconductor nanoparticle phosphor has a rod shape, the particle size refers, for example, to a length of a minor axis and a major axis measured with an electron microscope. When the semiconductor nanoparticle phosphor has a wire shape, the particle size refers, for example, to a length of a minor axis and a major axis measured with an electron microscope.

Though the content of the semiconductor nanoparticle phosphor (or a total amount thereof when two or more types of semiconductor nanoparticle phosphors are used) is not particularly restricted, the content is preferably within a range of 0.001 part by weight or more and 50 parts by weight or less, and more preferably 0.01 part by weight or more and 20 parts by weight or less, with respect to 100 parts by weight of the ionic liquid in core portion 2. When the content of the semiconductor nanoparticle phosphor is smaller than 0.001 part by weight with respect to 100 parts by weight of the ionic liquid in core portion 2, light emission from the semiconductor nanoparticle phosphor tends to be excessively weak. When the content of the semiconductor nanoparticle phosphor exceeds 50 parts by weight with respect to 100 parts by weight of the ionic liquid in core portion 2, uniform dispersion in the ionic liquid tends to be difficult.

The resin including the constitutional unit derived from the ionic liquid with the semiconductor nanoparticle phosphor dispersed in the resin (a polymer matrix) may be formed into particles in any method, however, for example, the polymer matrix is able to be physically crushed to have a desired size to suitably produce the particles.

Phosphor containing particle 1 of the first invention has in core portion 2 an ion that configures an ionic liquid, coordinated on a surface of the semiconductor nanoparticle phosphor to stabilize nanoparticles, and thus allows high light emission efficiency. Furthermore, as the semiconductor nanoparticle phosphor is dispersed in a resin including a constitutional unit derived from an ionic liquid which has a low oxygen and moisture permeability, particles are able to be produced while the semiconductor nanoparticle phosphor's agglomeration is prevented, so that a high optical characteristic is able to be maintained, and even after the particles are produced, the semiconductor nanoparticle phosphor's degradation due to moisture and oxygen is able to be reduced. Thus, when the semiconductor nanoparticle phosphor is excited and thus caused to emit light, it is less likely to be photooxidized and thus has an excellent chemical stability.

The shape of the particulate matter of resin 4 (or core portion 2) in phosphor containing particle 1 of the first invention may be globular (spherical, oblate, prolate), hexahedral, tetrahedral, or the like, and is not particularly limited. The particle size of the particulate matter of resin 4 (core portion 2) is not particularly limited, either, although it is preferably in a range of about 0.01 μm or more and about 100 μm or less. Furthermore, in particular, preferably, the particulate matter of resin 4 is spherical with a particle size of about 0.1 μm or more and about 30 μm or less, since having a size similar to a conventional phosphor used for an LED device such as a white color LED allows mounting in the LED device or the like through a production process similar to that for conventional phosphor advantageously. Further, the particulate matter of resin 4 that is spherical is also advantageous in that it facilitates forming the shell portion, which is formed after the core portion is formed, and is also easily dispersible when it is dispersed in a translucent medium. Note that the particle size of the particulate matter of resin 4 indicates a size of the particulate matter (or that of a major axis of the particulate matter when the particulate matter has major and minor axes) as observed with an optical microscope or a scanning electron microscope (SEM), or a value as measured with a particle size distribution measurement device.

Phosphor containing particle 1 of the first invention further comprises shell portion 5 which is a matter in the form of a layer of resin which includes a constitutional unit derived from an ionic liquid and coats at least a portion of the particulate matter of resin 4 (or core portion 2) as described above. In phosphor containing particle 1 according to the first invention, shell portion 5 is able to coat the particulate matter of resin (or core portion 2) without performing a heating treatment to as high a reaction temperature as 100° C. or higher and 400° C. or lower, such as coating by a conventional atomic layer deposition method, which is able to advantageously prevent the semiconductor nanoparticle phosphor from having characteristics impaired when coating the particulate matter and thus provide a phosphor containing particle having high light emission efficiency. Further, by coating at least a portion of the particulate matter of resin 4 (or core portion 2) with shell portion 5, degradation of the semiconductor nanoparticle phosphor caused by oxygen and moisture can be suppressed, and a phosphor containing particle having enhanced chemical stability can be obtained. From a viewpoint of obtaining enhanced chemical stability, shell portion 5 is preferably formed to coat 10% or more of the surface of the particulate matter of resin 4 (or core portion 2), more preferably 50% or more thereof, particularly preferably the entire surface of the particulate matter of resin 4 (or core portion 2).

The thickness of the shell portion is not particularly limited, either, although it is preferably within a range of about 0.01 μm or more and about 10 μm or less. Further, the shell portion particularly preferably has a thickness of about 0.1 μm or more and about 5 μm or less and is a uniform film over the entire surface of the core portion, since such a shell portion is able to advantageously suppress degradation of the semiconductor nanoparticle phosphor due to oxygen and moisture in the core portion and a phosphor-containing particle with improved chemical stability can thus be obtained.

Note that, in phosphor containing particle 1 of the first invention, it can be confirmed that shell portion 5 is formed to coat at least a portion of core portion 2 for example as follows: any source of light is caused to emit light to be incident on phosphor containing particle 1 so that core portion 2 in which semiconductor nanoparticle phosphor 3 is dispersed emits fluorescent light, and shell portion 5, which does not include the semiconductor nanoparticle phosphor, can be confirmed by observing a cross section of the phosphor containing particle with a fluorescent microscope or SEM-EDX or the like. For example, when observed with a fluorescent microscope, fluorescence cannot be detected from shell portion 5, and when observed with SEM-EDX, no element forming a phosphor is detected in shell portion 5. In some cases, these are able to be combined for confirmation.

The phosphor containing particle of the first invention is also able to be provided as a particle containing a nanoparticle phosphor in the shell portion (i.e., a phosphor containing particle). This case is also able to effectively reduce degradation of the semiconductor nanoparticle phosphor in the core portion. However, when the semiconductor nanoparticle phosphor in the shell portion is degraded, emission intensity decreases despite absorption of excitation light, which may cause a decrease in light emission efficiency as a phosphor containing particle. From such a viewpoint, in the phosphor containing particle of the first invention, it is preferable that the shell portion does not include the semiconductor nanoparticle phosphor.

The resin including the constitutional unit derived from the ionic liquid that is used for shell portion 5 may be identical or different in type to or from the resin including the constitutional unit derived from the ionic liquid that is used for core portion 2.

When the resin including the constitutional unit derived from the ionic liquid that is used for shell portion 5 is identical in type to the resin including the constitutional unit derived from the ionic liquid that is used for core portion 2, e.g., when they both use MOE-200T or 1-(3-acryloyloxy-propyl)-3-methylimidazolium bis(trifluoromethanesulfonyl) imide as an ionic liquid having a polymerizable functional group, the identical materials facilitate forming the shell portion for the core portion and allow a matter in the form of a uniform layer to be effectively be formed.

When the resin including the constitutional unit derived from the ionic liquid having a polymerizable functional group that is used for shell portion 5 is different in type from the resin including the constitutional unit derived from the ionic liquid having a polymerizable functional group that is used for core portion 2, for example, by using a resin that has larger durability and larger weather resistance to form the shell portion, it is possible to obtain a phosphor containing particle having large durability and large weather resistance even if the resin forming the core portion has relatively low durability and relatively low weather resistance.

Furthermore, in phosphor containing particle 1 of the first invention, preferably, at least one of the resin in the core portion and the resin in the shell portion is a resin including a constitutional unit derived from an ionic liquid having a polymerizable functional group. In that case, whether the resin including the constitutional unit derived from the ionic liquid having the polymerizable functional group that is used for shell portion 5 may be identical or different in type to or from the resin including the constitutional unit derived from the ionic liquid having the polymerizable functional group that is used for core portion 2, they preferably both have a (meth)acrylic acid ester group as the polymerizable functional group. Suitable examples of the ionic liquid having the (meth)acrylic acid ester group include (2-(methacryloyloxy)-ethyltrimethyl ammonium bis(trifluoromethane sulfonyl)imide), and 1-(3-acryloyloxy-propyl)-3-methylimidazolium bis(trifluoromethanesulfonyl) imide, as indicated above.

In phosphor containing particle 1 of the first invention, by applying an ionic liquid having a polymerizable functional group to core portion 2 and shell portion 5, the ionic liquid, functioning as a dispersion medium for the semiconductor nanoparticle phosphor, is able to be polymerized as it is in the presence of the polymerizable functional group, and agglomeration which would otherwise occur in solidification of the resin in which the semiconductor nanoparticle phosphor is dispersed can be significantly suppressed. In particular, using a (meth)acrylic acid ester group as a polymerizable functional group in both core portion 2 and shell portion 5 allows polymerization to be done by heating or a catalytic reaction, and solidification to be done from a liquid state with a dispersed state maintained as it is. As a result, the semiconductor nanoparticle phosphor is able to be electrostatically stabilized and firmly protected and has a surface protected from air and moisture, and a phosphor containing particle having high light emission efficiency is thus able to be provided.

Furthermore, in phosphor containing particle 1 of the first invention, a resin including a constitutional unit derived from an ionic liquid having a polymerizable functional group that is used for core portion 2 and shell portion 5 may have a cross-linking agent blended therein. In phosphor containing particle 1 of the first invention, a resin including a constitutional unit derived from an ionic liquid having a polymerizable functional group that is used for core portion 2 and shell portion 5, that has a cross-linking agent blended therein, has a cross-linking structure and is thus a stronger resin. While the cross-linking agent may be a conventionally known, appropriate cross-linking agent and is not particularly limited, examples of the cross-linking agent include diethyleneglycol dimethacrylate and 1,1,1-trimethylol propane triacrylate.

In phosphor containing particle 1 of the first invention, the resin in the shell portion preferably contains a cross-linking agent at a mixing ratio larger than that of the cross-linking agent contained by the resin in the core portion. In core portion 2 including semiconductor nanoparticle phosphor 3, semiconductor nanoparticle phosphor 3 can be electrostatically stabilized and firmly protected by the ionic liquid, and accordingly, in core portion 2, the resin containing the constitutional unit derived from the ionic liquid that stabilizes semiconductor nanoparticle phosphor 3 is mixed at an increased ratio, whereas in shell portion 5, a cross-linking agent is mixed at an increased ratio to maintain strength, so that a phosphor containing particle having high light emission efficiency and protected from air and moisture is able to be easily obtained. Specifically, suitably, the cross-linking agent contained by the resin in the shell portion has a weight ratio of more than 50% (more preferably more than 50% and 75% or less) with respect to the entire resin, and the cross-linking agent contained by the resin in the core portion has a weight ratio of 50% or less (more preferably 10% or more and 50% or less) with respect to the entire resin.

Although the particle size of phosphor containing particle 1 of the first invention is not particularly limited, a range of about 100 nm or more and about 30 μm or less is preferable, and a range of about 1 μm or more and about 20 μm or less is more preferable, since having a size similar to a conventional phosphor used for an LED device such as a white color LED allows mounting in the LED device or the like through a production process similar to that for conventional phosphor. This is because when phosphor containing particle 1 has a particle size less than about 100 nm, having the small particle size tends to cause agglomeration and make it difficult to disperse such particles in a translucent medium, whereas when phosphor containing particle 1 has a particle size exceeding about 30 μm, it tends to make it difficult to disperse such particles in a translucent medium through a process similar to that for a conventional phosphor. Note that the particle size of phosphor containing particle 1 indicates a size of a particulate matter (or that of a major axis thereof when it has major and minor axes) as observed with an optical microscope or a scanning electron microscope (SEM), or a value as measured with a particle size distribution measurement device.

(Method of Producing Phosphor Containing Particle of First Invention)

The phosphor containing particle of the first invention described above is able to be suitably produced for example as follows: a particulate matter of resin including a constitutional unit derived from an ionic liquid (preferably an ionic liquid having a polymerizable functional group) with a semiconductor nanoparticle phosphor dispersed therein and an ionic liquid (preferably having a polymerizable functional group and preferably not containing the semiconductor nanoparticle phosphor) are mixed together, and dispersion-polymerized to produce a phosphor containing particle comprising core portion 2 which is a particulate matter of resin 4 including a constitutional unit derived from an ionic liquid with semiconductor nanoparticle phosphor 3 dispersed therein and shell portion 5 which is a matter in the form of a layer of resin which includes a constitutional unit derived from an ionic liquid and coats at least a portion of core portion 2, wherein the shell portion 5 does not include the semiconductor nanoparticle phosphor.

Dispersion polymerization for forming a resin constituting shell portion 5 is able to be done as follows: for example, when the ionic liquid having a polymerizable functional group that is used for forming shell portion 5 is MOE-200T, dispersion polymerization is able to be done for example at 60° C. or higher and 100° C. or lower for 1 hour or more and 10 hours or less, and when the ionic liquid having a polymerizable functional group that is used for forming shell portion 5 is 1-(3-acryloyloxy-propyl)-3-methylimidazolium bis(trifluoromethanesulfonyl) imide, dispersion polymerization is able to be done for example at 60° C. or higher and 100° C. or lower for 1 hour or more and 10 hours or less. Thus, in contrast to the coating done in the conventional atomic deposition method, a phosphor containing particle can be suitably produced with shell portion 5 formed on a surface of a particulate matter of resin (or a core portion) without heating the semiconductor nanoparticle phosphor to degrade its characteristics.

<Light Emitting Device of First Invention>

FIG. 1 is a diagram schematically showing a light emitting device 11 of a preferable example using phosphor containing particle 1 of the first invention (a light emitting device of the first invention). As shown in FIG. 1, light emitting device 11 of the first invention also provides a light emitting device (an LED package) 11 comprising a light source 12 and a wavelength converter in which phosphor containing particles 1 of the first invention as described above are dispersed in a translucent medium 13. As has been set forth above, the phosphor containing particle in one aspect of the present invention is good in handleability, and by producing it in a size approximately the same as a currently used phosphor, it is able to be used in a form similar to that of a currently commercially used phosphor without changing a currently used process. In light emitting device 11 shown in FIG. 1, components other than phosphor containing particle 1, i.e., light source 12, translucent medium 13, a lead wire 14, a frame body 15, etc. are not particularly limited and are able to be conventionally known, appropriate components.

In light emitting device 11 of the first invention, light source 12 is not particularly limited and is able to be a light emitting diode (LED), a laser diode (LD), etc.

In light emitting device 11 of the first invention, translucent medium 13 for sealing light source 12 and phosphor containing particle 1 is not particularly limited, and includes epoxy, silicone and (meth)acrylate, silica glass, silica gel, siloxane, sol-gel, hydrogel, agarose, cellulose, polyether, polyethylene, polyvinyl, polydiacetylene, polyphenylene vinylene, polystyrene, polypyrrole, polyimide, polyimidazole, polysulfone, polythiophene, polyphosphate, poly(meth)acrylate, polyacrylamide, polypeptide, polysaccharide, and the like. A plurality thereof may be combined together and used as the translucent medium.

FIG. 2 is a diagram schematically showing a light emitting device 21 of another preferable example of the light emitting device of the first invention. Note that in FIG. 2, any portion having a configuration similar to that of light emitting device 11 of the example shown in FIG. 1 is identically denoted and will not be described. Light emitting device 21 of the example shown in FIG. 2 differs from light emitting device 11 of the example shown in FIG. 1 in that the former includes a phosphor containing particle 22 in which in the core a red fluorescent light emitting semiconductor nanoparticle phosphor is dispersed in a resin including a constitutional unit derived from an ionic liquid and a phosphor containing particle 23 in which in the core a green fluorescent light emitting semiconductor nanoparticle phosphor is dispersed in a resin including a constitutional unit derived from an ionic liquid.

As has been set forth above, the phosphor containing particle of the first invention is good in handleability, and by producing it in a size approximately the same as a currently used phosphor, it is able to be used in a form similar to that of a currently commercially used phosphor without changing a currently used process. According to light emitting device 21 shown in FIG. 2, by producing a light emitting device in a process similar to that for a conventional phosphor, and furthermore, using a phosphor containing particle including semiconductor nanoparticle phosphors having different wavelengths, a light emitting device which emits light in a desired color is able to be produced. Note that, as in light emitting device 21 shown in FIG. 2, when phosphor containing particle 22 in which in the core a red fluorescent light emitting semiconductor nanoparticle phosphor is dispersed in a resin including a constitutional unit derived from an ionic liquid and phosphor containing particle 23 in which in the core a green fluorescent light emitting semiconductor nanoparticle phosphor is dispersed in a resin including a constitutional unit derived from an ionic liquid are used together, a light emitting device presenting white light emission with high color reproducibility is able to be obtained. Therefore, a light emitting diode (LED) which emits blue light and a laser diode (LD) which emits blue light and the like are able to be suitably used.

Note that while in light emitting device 21 shown in FIG. 2, a ratio applied to mix together phosphor containing particle 22 in which in the core portion a red fluorescent light emitting semiconductor nanoparticle phosphor is dispersed in a resin including a constitutional unit derived from an ionic liquid and phosphor containing particle 23 in which in the core portion a green fluorescent light emitting semiconductor nanoparticle phosphor is dispersed in a resin including a constitutional unit derived from an ionic liquid is not particularly limited, with phosphor containing particle 22 assumed to have a weight ratio defined as 100, phosphor containing particle 23 is preferably within a range of about 10 or more and about 1000 or less and more preferably within a range of about 20 or more and about 500 or less. This is because when phosphor containing particle 23 has a weight ratio lower than about 10 with phosphor containing particle 22 being defined as 100, the emitted color tends to have a color significantly deviating from white and closer to red due to a difference in light emission intensity between red and green, and when phosphor containing particle 23 has a weight ratio exceeding 1000 with phosphor containing particle 22 being defined as 100, the emitted color tends to have a color significantly deviating from white and closer to green due to a difference in light emission intensity between red and green.

It should be noted that the light emitting device of one aspect of the present invention is as a matter of course not limited to the examples shown in FIGS. 1 and 2, and, for example, three or more types of semiconductor nanoparticle phosphors may be used.

<Phosphor Containing Sheet of First Invention>

FIG. 3 is a diagram schematically showing a preferable example of a phosphor containing sheet of the first invention. The phosphor containing sheet of the first invention shown in FIG. 3 is such that phosphor containing particles 1 of the first invention are dispersed in a sheet-shaped translucent medium 32. As has been set forth above, the phosphor containing particle of the first invention is good in handleability, and by producing it in a size approximately the same as a currently used phosphor, it is able to be used in a form similar to that of a currently commercially used phosphor without changing a currently used process. Accordingly, a phosphor containing sheet is able to be produced, like a phosphor containing sheet 31 of the first invention shown in FIG. 3, in a production process similar to that for a conventional phosphor. Such a phosphor containing sheet of the first invention is able to be suitably applied to a liquid crystal back light, a white light LED device, etc. similarly as conventional.

Furthermore, the phosphor containing sheet using the phosphor containing particle of the first invention alleviates a constraint on a material for a medium in which the phosphor containing particles are dispersed and thus provides an increased degree of freedom in selecting the material for the medium for the following grounds (1) and (2):

(1) In contrast to a semiconductor nanoparticle phosphor resinified in an uncovered state, as conventional, according to the present invention, a semiconductor nanoparticle phosphor may be resinified in a state in which it is included in a phosphor containing particle and thus protected thereby, and it is unnecessary to care about degradation of the semiconductor nanoparticle phosphor at the time of production; and (2) In contrast to an uncovered semiconductor nanoparticle phosphor included in a medium, as conventional, according to the present invention, a semiconductor nanoparticle phosphor is used in a state where it is protected by a phosphor containing particle, and it is unnecessary to care about degradation of the semiconductor nanoparticle phosphor in use.

Furthermore, as it is unnecessary to care about degradation of the semiconductor nanoparticle phosphor in use, as described above, a portion for protecting the sheet is unnecessary, and a space is also able to be saved. In other words, a portion for protection which has conventionally been essential in order to prevent moisture and oxygen which are a cause of degradation of a semiconductor nanoparticle phosphor in an uncovered state is able to be dispensed with and thus the sheet is able to be reduced in thickness. More specifically, it is unnecessary to provide an edge portion (or it is able to be reduced), and accordingly, a space is able to be saved in a planar direction, and it is unnecessary to provide a protective layer for protection (or it is able to be reduced), and accordingly, a space is able to be saved in the thickness direction.

As translucent medium 32 used for the phosphor containing sheet of the first invention, a medium similar to translucent medium 13 described above for the light emitting device of the first invention is able to be suitably used. Furthermore, a method of forming into a sheet the translucent medium in which phosphor containing particles of the first invention are dispersed is similar to that of producing a conventional phosphor containing sheet, e.g., initially as a coating liquid for forming a phosphor sheet a solution in which phosphor containing particles are dispersed in a resin (hereinafter referred to as a "sheet producing, phosphor containing particle dispersed silicone resin") is prepared. The sheet producing, phosphor containing particle dispersed silicone resin is obtained by mixing the phosphor containing particles and the resin. When an addition reaction type silicone resin is used, and a compound containing an alkenyl group bonded to a silicon atom and a compound having a hydrogen atom bonded to a silicon atom are mixed, a curing reaction may start even at room temperature, and accordingly, a hydrosilylating reaction retarding agent such as an acetylene compound may be blended with the sheet producing, phosphor containing particle dispersed silicone resin to extend pot life. Furthermore, it is also possible to mix a dispersant, a leveling agent etc. as an additive for stabilizing a coating film, an adhesion assisting agent etc. such as a silane coupling agent, etc. as a modifier for a surface of the sheet, etc. with the sheet producing, phosphor containing particle dispersed silicone resin. Furthermore, it is also possible to mix fine alumina particles, fine silica particles, fine silicone particles, etc. with the sheet producing, phosphor containing particle dispersed silicone resin as a phosphor sedimentation suppressor.

A solvent may be added to provide a solution to make flowability appropriate, if necessary. The solvent is not particularly limited as long as it is able to adjust the resin in a flowing state in viscosity. For example, toluene, methyl ethyl ketone, methyl isobutyl ketone, hexane, terpineol, etc. are mentioned.

After these components are blended to provide a prescribed composition, a homogenizer, a self-revolving agitator, a triple roller, a ball mill, a planetary ball mill, a bead mill or a similar agitator and kneader is used for uniform mixture and dispersion to obtain the sheet producing, phosphor containing particle dispersed silicone resin. After or during the mixture and dispersion, degassing in a vacuum or a decompressed condition is also preferably performed.

Subsequently, the sheet producing, phosphor containing particle dispersed silicone resin is applied on a base member and dried. The resin is able to be applied with a reverse roll coater, a blade coater, a slit-die coater, a direct gravure coater, an offset gravure coater, a kis coater, a natural roll coater, an air knife coater, a roll blade coater, baribar roll blade coater, a two stream coater, a rod coater, a wire bar coater, an applicator, a dip coater, a curtain coater, a spin coater, a knife coater etc. Furthermore, the phosphor containing sheet of the first invention is also be able to be produced using printing methods such as screen printing, photogravure, planography. When using a printing method, screen printing is preferably used.

The sheet is able to be dried using a general heating device such as a hot air dryer and an infra-red dryer. The sheet is able to be heated and cured using a general heating device such as a hot air dryer and an infra-red dryer. In that case, the sheet is heated and cured normally at 40° C. or higher and 250° C. or lower for 1 minute or more and 5 hours or less, preferably at 100° C. or higher and 200° C. or lower for 2 minutes or more and 3 hours or less.

Note that while FIG. 3 shows a case where phosphor containing particle 1 of the first invention shown in FIG. 1 is used, this is not exclusive, and two or more types of semiconductor nanoparticle phosphors may of course be included.

<Phosphor Containing Particle of Second Invention>

Figure 4:
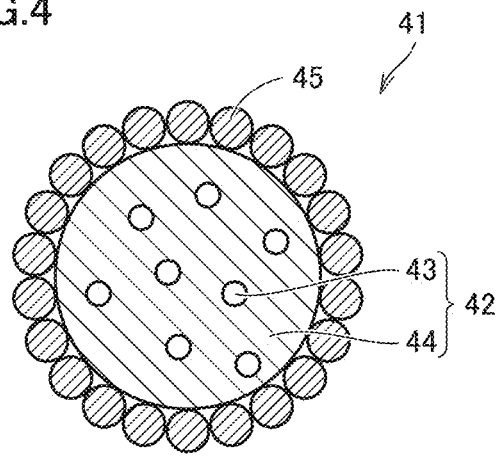
FIG. 4 is a diagram schematically showing a preferable example of a phosphor containing particle of the second invention.

FIG. 4 is a diagram schematically showing a preferable example of a phosphor containing particle (a microbead) of the second invention. A phosphor containing particle 41 of the second invention is characterized by comprising a particulate matter 42 of resin 44 including a constitutional unit derived from an ionic liquid, with a semiconductor nanoparticle phosphor 43 dispersed therein, and a metal oxide layer 45 coating at least a portion of particulate matter 42 of resin 44.

The ionic liquid in the phosphor containing particle of the second invention is the same as described for the phosphor containing particle of the first invention, and accordingly, will not be described for any redundant portion.

The ionic liquid used for the phosphor containing particle of the second invention also preferably has a polymerizable functional group. In particular, when MOE-200T is used as an ionic liquid having a polymerizable functional group, MOE-200T, having a positive zeta potential, allows polymer particles to repel each other in suspension polymerization and the polymerization to be done with the polymer particles dispersed, and particulate matter 42 of resin 44 without agglomeration is thus able to be obtained, which is preferable.

Furthermore, for the phosphor containing particle of the second invention, suitable conditions in accordance with a type or an amount of an ionic liquid having a polymerizable functional group to be used are selected as appropriate as conditions for a temperature and a time period for polymerization of the ionic liquid having the polymerizable functional group while the semiconductor nanoparticle phosphor is dispersed, and the conditions are not particularly restricted.

The semiconductor nanoparticle phosphor in the phosphor containing particle of the second invention is the same as described for the phosphor containing particle of the first invention, and accordingly, will not be described for any redundant portion. FIG. 4 shows a plurality of semiconductor nanoparticle phosphors 43 of a single type dispersed in resin 44 including a constitutional unit derived from an ionic liquid.

In the phosphor containing particle of the second invention, though the content of the semiconductor nanoparticle phosphor (or a total amount thereof when two or more types of semiconductor nanoparticle phosphors are used) is not particularly restricted, the content is preferably within a range of 0.001 part by weight or more and 50 parts by weight or less, and more preferably 0.01 part by weight or more and 20 parts by weight or less, for example, with respect to 100 parts by weight of the ionic liquid. When the content of the semiconductor nanoparticle phosphor is smaller than 0.001 part by weight with respect to 100 parts by weight of the ionic liquid, light emission from the semiconductor nanoparticle phosphor tends to be excessively weak. When the content of the semiconductor nanoparticle phosphor exceeds 50 parts by weight with respect to 100 parts by weight of the ionic liquid, uniform dispersion in the ionic liquid tends to be difficult.

Thus, the phosphor containing particle of the second invention also has an ion that configures an ionic liquid coordinated on a surface of the semiconductor nanoparticle phosphor to stabilize nanoparticles, and thus allows high light emission efficiency. Furthermore, as the semiconductor nanoparticle phosphor is dispersed in a resin including a constitutional unit derived from an ionic liquid which has a low oxygen and moisture permeability, particles are able to be produced while the semiconductor nanoparticle phosphor's agglomeration is prevented, so that a high optical characteristic is able to be maintained, and even after the particles are produced, the semiconductor nanoparticle phosphor's degradation due to moisture and oxygen is able to be reduced. Thus, when the semiconductor nanoparticle phosphor is excited and thus caused to emit light, it is less likely to be photooxidized and thus has an excellent chemical stability.

The shape of particulate matter 42 of resin 44 in the phosphor containing particle of the second invention may be globular (spherical, oblate, prolate), hexahedral, tetrahedral, or the like, and is not particularly limited. The particle size of particulate matter 42 of resin 44 is not particularly limited, either, although it is preferably in a range of about 1 μm or more and about 100 μm or less. In particular, preferably, particulate matter 42 of resin 44 is spherical with a particle size of about 1 μm or more and about 50 μm or less, since having a size similar to a conventional phosphor used for an LED device such as a white color LED allows mounting in the LED device or the like through a production process similar to that for conventional phosphor advantageously. Further, particulate matter 42 of resin 44 that is spherical is also advantageous in that it allows a particulate matter of metal oxide to uniformly adhere thereto. Note that the particle size of particulate matter 42 of resin 44 indicates a size of the particulate matter (or that of a major axis thereof when it has major and minor axes) as observed with an optical microscope or a scanning electron microscope (SEM), or a value as measured with a particle size distribution measurement device.

Phosphor containing particle 41 of the second invention further comprises a metal oxide layer 45 coating at least a portion of particulate matter 42 of resin 44 as described above. In phosphor containing particle 41 of the second invention, metal oxide layer 45 is able to coat a particulate matter of resin, which is able to advantageously prevent the semiconductor nanoparticle phosphor from having characteristics impaired when coating the particulate matter and thus provide a phosphor containing particle having high light emission efficiency. Further, by coating at least a portion of particulate matter 42 of resin 44 with a metal oxide layer, degradation of the semiconductor nanoparticle phosphor caused by oxygen and moisture can be suppressed, and a phosphor containing particle having enhanced chemical stability can be obtained. From a viewpoint of obtaining enhanced chemical stability, the metal oxide layer is preferably formed to coat 10% or more of the surface of the particulate matter of resin, more preferably 50% or more thereof, particularly preferably the entire surface of the particulate matter of resin.

Examples of the metal oxide used for forming the metal oxide layer include $SiO_2$, $ZnO$, $TiO_2$, $CeO_2$, $SnO_2$, $ZrO_2$, $Al_2O_3$, $ZnO:Mg$, $Y_2O_3$, $MgO$, and the like for example. In particular, when the metal oxide layer is formed using a metal oxide of $SiO_2$ and the above-described MOE-200T is used for forming a particulate matter of resin, MOE-200T, having a positive zeta potential, and $SiO_2$, having a negative zeta potential, allow metal oxide layer 45 to be more firmly attached to particulate matter 42 of resin 44 advantageously.

The metal oxide used for forming metal oxide layer 45 in phosphor containing particle 41 of the second invention is preferably a particulate matter that is able to have a globular (spherical, oblate, prolate), hexahedral, tetrahedral, or similar shape, and by being a spherical matter having a particle size of about 1 nm or more and about 1 μm or less, more suitably about 10 nm or more and about 50 nm or less, it is also able to advantageously prevent intensified light scattering, which is particularly preferable. Note that the particle size of the metal oxide indicates a size of the particulate matter (or that of a major axis thereof when it has major and minor axes) as observed with an optical microscope or a scanning electron microscope (SEM), or a value as measured with a particle size distribution measurement device.

Figure 5:
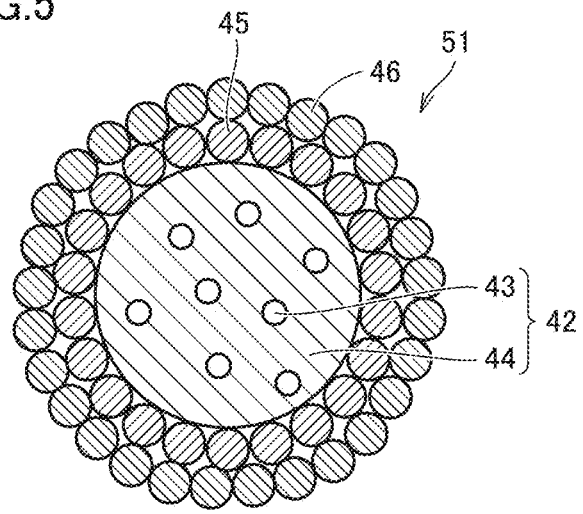
FIG. 5 is a diagram schematically showing another preferable example of the phosphor containing particle of the second invention.

FIG. 5 is a diagram schematically showing another preferable example of a phosphor containing particle (a microbead) of the second invention. In the phosphor containing particle of the second invention, the metal oxide layer may be a stack of layers of a particulate matter of a metal oxide. A phosphor containing particle 51 of the example shown in FIG. 5 is the same as phosphor containing particle 41 of the example shown in FIG. 4 except that the former further comprises a metal oxide layer 46 to coat metal oxide layer 45, and any portion having an identical configuration is identically denoted and the portion will not be described redundantly. As shown in FIG. 5, the metal oxide layer that is a stack of layers of a particulate matter of a metal oxide is advantageous in that it is able to reliably coat the entire surface of the particulate matter of resin, and thus allows a phosphor containing particle to have enhanced water resistance and an enhanced high gas barrier property.

(Method of Producing Phosphor Containing Particle of Second Invention)

The phosphor containing particle in one aspect of the present invention as described above is able to be suitably produced for example as follows: a particulate matter of resin including a constitutional unit derived from an ionic liquid (preferably an ionic liquid having a polymerizable functional group) with a semiconductor nanoparticle phosphor dispersed therein, and a metal oxide are dispersed in a dispersion medium and the dispersion medium is evaporated at a temperature of 30° C. or higher and 150° C. or lower to cause the metal oxide to adhere to the particulate matter of resin to form a metal oxide layer to thus form the phosphor containing particle.

Suitable dispersion media for dispersing the particulate matter of resin and the metal oxide (preferably, a particulate matter of the metal oxide with a particle size of about 1 nm or more and about 1 μm or less, as described above) include, for example, ethanol, water, methanol, n-propanol, n-hexane, toluene and the like. Ultrasonic waves can be suitably used for dispersing the particulate matter of resin and the metal oxide in the dispersion medium.

The dispersion medium is evaporated at 30° C. or higher and 150° C. or lower, preferably 50° C. or higher and 100° C. or lower, as has been described above. This is because when the dispersion medium is evaporated at a temperature lower than 30° C., it takes a long time to evaporate the dispersion medium, whereas when the dispersion medium is evaporated at a temperature exceeding 150° C., the semiconductor nanoparticle phosphor may be heated and thus degraded. Specifically, for example, a hot plate is used to heat the dispersion medium at about 60° C. for about 3 hours to evaporate the dispersion medium. Thus, in contrast to the coating done in the conventional atomic deposition method, a phosphor containing particle can be suitably produced with a metal oxide layer formed of a metal oxide adhering to a surface of a particulate matter of resin without heating the semiconductor nanoparticle phosphor to degrade its characteristics.

<Light Emitting Device of Second Invention>

Figure 6A:
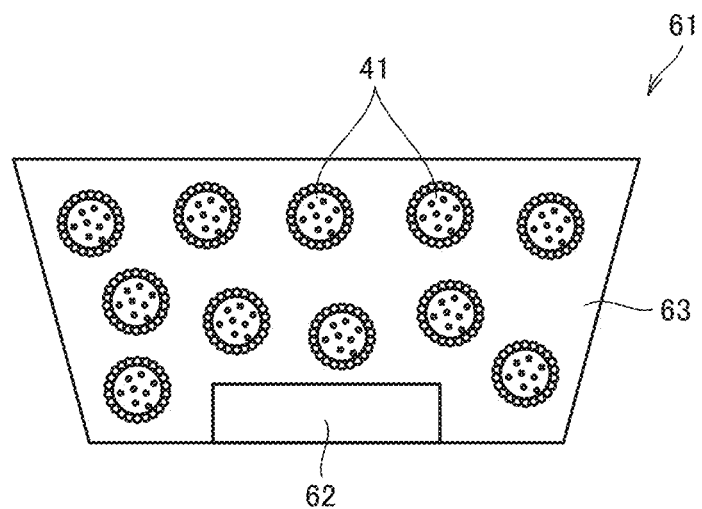
FIG. 6A generally, schematically shows a light emitting device 61 of the second invention, and FIG. 6B schematically shows a phosphor containing particle 41 of the second invention included in light emitting device 61.
Figure 6B:
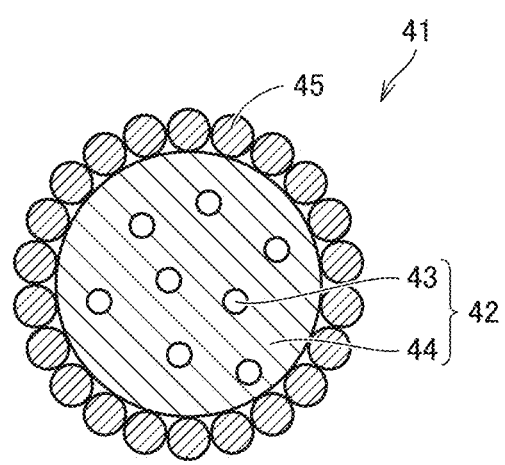

FIG. 6A generally, schematically shows a light emitting device 61 of the second invention, and FIG. 6B schematically shows phosphor containing particle 41 of the second invention included in light emitting device 61. As shown in FIGS. 6A and 6B, the light emitting device of the second invention is a light emitting device (an LED package) comprising a light source 62 and a wavelength converter in which phosphor containing particles 41 of the second invention as described above are dispersed in a translucent medium 63. Light-emitting device 61 of the second invention is similar to the light emitting device of the first invention as described above except that the phosphor containing particle of the first invention is replaced with the phosphor containing particle of the second invention, and accordingly, will not be described for any redundant portion.

Note that while FIGS. 6A and 6B show a case where phosphor containing particle 41 of the example shown in FIG. 4 is used, this is not exclusive, and phosphor containing particle 51 of the example shown in FIG. 5 may be used or two or more types of semiconductor nanoparticle phosphors may be included.

<Phosphor Containing Sheet of Second Invention>

Figure 7A:
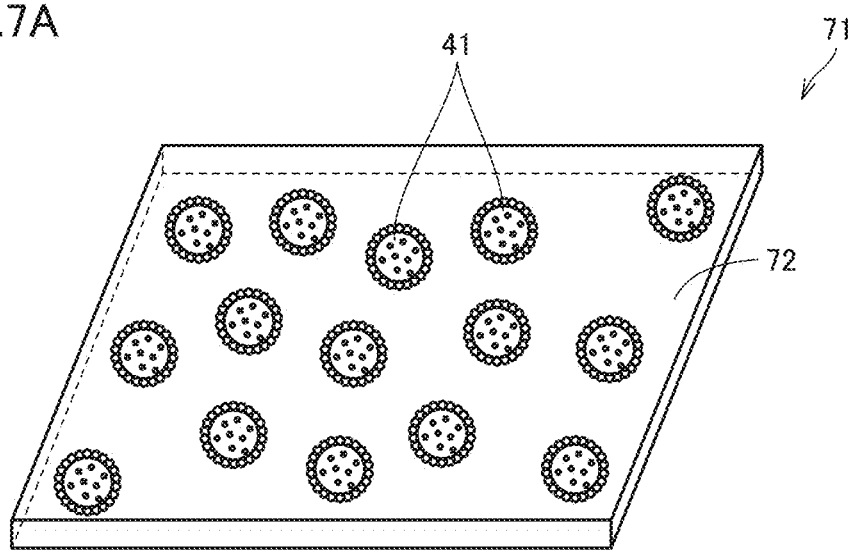
FIG. 7A generally, schematically shows a phosphor containing sheet 71 of the second invention, and FIG. 7B schematically shows phosphor containing particle 41 of the second invention included in phosphor containing sheet 71.
Figure 7B:
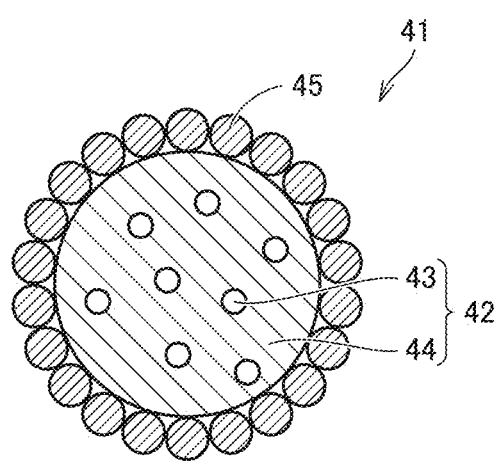

FIG. 7A generally, schematically shows a phosphor containing sheet 71 of the second invention, and FIG. 7B schematically shows phosphor containing particle 41 of the second invention included in phosphor containing sheet 71. Phosphor containing sheet 71 of the second invention shown in FIGS. 7A and 7B is such that phosphor containing particles 41 of the second invention are dispersed in a sheet-shaped translucent medium 72. Phosphor containing sheet 71 of the second invention is similar to the phosphor containing sheet of the first invention as described above except that the phosphor containing particle of the first invention is replaced with the phosphor containing particle of the second invention, and accordingly, will not be described for any redundant portion.

Note that while FIGS. 7A and 7B show a case where phosphor containing particle 41 of the example shown in FIG. 4 is used, this is not exclusive, and phosphor containing particle 51 of the example shown in FIG. 5 may be used or two or more types of semiconductor nanoparticle phosphors may be included.

Although the present disclosure has been described and illustrated in detail, it is clearly understood that the same is by way of illustration and example only and is not to be taken by way of limitation, the scope of the present invention being interpreted by the terms of the appended claims.

What is claimed is:

1. A phosphor containing particle comprising:
a particulate matter of resin including a constitutional unit derived from an ionic liquid with a semiconductor nanoparticle phosphor dispersed therein; and
a metal oxide layer coating at least a portion of the particulate matter of resin, wherein
the metal oxide layer includes a particulate matter of a metal oxide having a spherical shape and a particle size of about 1 nm or more and about 1 μm or less.

2. The phosphor containing particle according to claim 1, wherein the metal oxide layer coats an entire surface of the particulate matter of resin.

3. The phosphor containing particle according to claim 1, wherein the ionic liquid is represented by the following general formula (I):

$$X^+Y^- \qquad (I),$$

where $X^+$ is a cation selected from among imidazolium ion, pyridinium ion, phosphonium ion, aliphatic quaternary ammonium ion, pyrrolidinium, and sulfonium, and $Y^-$ is an anion.

4. The phosphor containing particle according to claim 1, wherein the ionic liquid is represented by the following general formula (I):

$$X^+Y^- \qquad (I),$$

where $X^+$ is a cation, and $Y^-$ is an anion selected from among tetrafluoroboric acid ion, hexafluorophosphoric acid ion, bistrifluoromethyl sulfonyl imide acid ion, perchloric acid ion, tris(trifluoromethylsulfonyl) carbon acid ion, trifluoromethanesulfonic acid ion, trifluoroacetic acid ion, carbonic acid ion, and halogen ion.

5. The phosphor containing particle according to claim 1, wherein the ionic liquid is represented by the following general formula (I):

$$X^+Y^- \qquad (I),$$

where $X^+$ is a cation selected from among imidazolium ion, pyridinium ion, phosphonium ion, aliphatic quaternary ammonium ion, pyrrolidinium, and sulfonium, and $Y^-$ is an anion selected from among tetrafluoroboric acid ion, hexafluorophosphoric acid ion, bistrifluoromethyl sulfonyl imide acid ion, perchloric acid ion, tris(trifluoromethylsulfonyl) carbon acid ion, trifluoromethanesulfonic acid ion, trifluoroacetic acid ion, carbonic acid ion, and halogen ion.

6. The phosphor containing particle according to claim 5, wherein the cation in the ionic liquid is aliphatic quaternary ammonium ion.

7. The phosphor containing particle according to claim 5, wherein the anion in the ionic liquid is bistrifluoromethyl sulfonyl imide acid ion.

8. The phosphor containing particle according to claim 1, wherein the ionic liquid has a polymerizable functional group.

9. The phosphor containing particle according to claim 1, wherein the ionic liquid is (2-(methacryloyloxy)-ethyltrimethyl ammonium bis(trifluoromethane sulfonyl)imide), or 1-(3-acryloyloxy-propyl)-3-methylimidazolium bis(trifluoromethanesulfonyl) imide.

10. The phosphor containing particle according to claim 1, wherein the metal oxide layer is composed of any material of $SiO_2$, ZnO, $TiO_2$, $CeO_2$, $SnO_2$, $ZrO_2$, $Al_2O_3$, ZnO:Mg, $Y_2O_3$, and MgO or a combination of these materials.

11. The phosphor containing particle according to claim 1, wherein the particulate matter of resin is spherical with a particle size of about 1 μm or more and about 50 μm or less.

12. The phosphor containing particle according to claim 1, wherein the metal oxide layer is a stack of layers of the particulate matter of the metal oxide.

13. A light emitting device comprising a light source and a wavelength converter in which phosphor containing particles according to claim 1 are dispersed in a translucent medium.

14. A phosphor containing sheet in which phosphor containing particles according to claim 1 are dispersed in a sheet-shaped translucent medium.

15. The phosphor containing particle according to claim 1, wherein the particle size of the particulate matter of the metal oxide is about 10 nm or more and about 50 nm or less.

\* \* \* \* \*